(12) United States Patent
Owen

(10) Patent No.: US 10,938,277 B2
(45) Date of Patent: Mar. 2, 2021

(54) CONTROL MODULE FOR AN ELECTRIC MOTOR OR GENERATOR

(71) Applicant: PROTEAN ELECTRIC LIMITED, Surrey (GB)

(72) Inventor: Geoffrey Owen, Farnham (GB)

(73) Assignee: PROTEAN ELECTRIC LIMITED, Surrey (GB)

( * ) Notice: Subject to any disclaimer, the term of this patent is extended or adjusted under 35 U.S.C. 154(b) by 470 days.

(21) Appl. No.: 14/900,814

(22) PCT Filed: Jun. 20, 2014

(86) PCT No.: PCT/IB2014/062486
§ 371 (c)(1),
(2) Date: Dec. 22, 2015

(87) PCT Pub. No.: WO2014/207638
PCT Pub. Date: Dec. 31, 2014

(65) Prior Publication Data
US 2016/0172939 A1    Jun. 16, 2016

(30) Foreign Application Priority Data

Jun. 26, 2013  (GB) .................................. 1311393
Jun. 27, 2013  (GB) .................................. 1311583

(51) Int. Cl.
*H02K 9/19* (2006.01)
*H02K 11/20* (2016.01)
(Continued)

(52) U.S. Cl.
CPC ................ *H02K 9/19* (2013.01); *B60L 3/003* (2013.01); *B60L 3/0061* (2013.01);
(Continued)

(58) Field of Classification Search
CPC .......... H02K 1/187; H02K 21/22; H02K 9/19; H02K 9/22; H02K 11/33; H02K 11/20;
(Continued)

(56) References Cited

U.S. PATENT DOCUMENTS 4,908,738 A    3/1990  Kobari et al.
6,297,572 B1 * 10/2001  Sunaga .................. H02K 11/33
                                                        310/64
(Continued)

FOREIGN PATENT DOCUMENTS

EP    0884828 A2    12/1998
EP    2357361 A1    8/2011
(Continued)

OTHER PUBLICATIONS

Torri Takashi; Nakamura Masashi, Dynamo-Electric Machine, Sep. 26, 2003, Denso Corp; Toyota Motor Corp, JP 2003274606 (English Machine Translation).*

(Continued)

*Primary Examiner* — Quyen P Leung
*Assistant Examiner* — Alexander A Singh
(74) *Attorney, Agent, or Firm* — Nolte Lackenbach Siegel

(57) ABSTRACT

A control module for an electric motor having a stator that includes a first surface, wherein cooling fluid flows within the stator for providing cooling to the first surface, the control module having a power device having switching elements; a control device for controlling operation of the switching elements; a housing with a first side for mounting to the first surface, wherein the first side includes an aperture allowing a portion of the power device to contact the first surface when the housing is mounted to the first surface for cooling the switching elements, wherein the control device is mounted in the housing on an opposite side of the power device to the first side of the housing and an elastomer is (Continued)

located over the power device and the control device for providing an electrical insulation barrier over the switching elements and electrical components on the control device.

8 Claims, 8 Drawing Sheets

(51) Int. Cl.
| | |
|---|---|
| H02K 5/20 | (2006.01) |
| H02K 9/22 | (2006.01) |
| H02K 11/33 | (2016.01) |
| B60L 3/00 | (2019.01) |
| B60L 15/00 | (2006.01) |
| H02K 11/215 | (2016.01) |
| H02K 11/27 | (2016.01) |
| H02K 15/14 | (2006.01) |
| H02K 7/14 | (2006.01) |
| H02K 21/22 | (2006.01) |
| H02K 29/08 | (2006.01) |

(52) U.S. Cl.
CPC ............. *B60L 15/007* (2013.01); *H02K 5/20* (2013.01); *H02K 9/22* (2013.01); *H02K 11/20* (2016.01); *H02K 11/215* (2016.01); *H02K 11/27* (2016.01); *H02K 11/33* (2016.01); *H02K 15/14* (2013.01); *B60L 2220/12* (2013.01); *B60L 2220/14* (2013.01); *B60L 2220/16* (2013.01); *B60L 2220/58* (2013.01); *B60L 2240/425* (2013.01); *B60L 2240/525* (2013.01); *B60L 2270/145* (2013.01); *H01L 2224/49111* (2013.01); *H01L 2924/13055* (2013.01); *H01L 2924/13091* (2013.01); *H02K 7/14* (2013.01); *H02K 21/22* (2013.01); *H02K 29/08* (2013.01); *Y02T 10/64* (2013.01)

(58) Field of Classification Search
CPC ........ H02K 11/215; H02K 11/27; H02K 5/20; H02K 15/14; H02K 29/08; H02K 7/14; B60L 3/003; B60L 3/0061; B60L 15/007; B60L 2220/12; B60L 2220/14; B60L 2220/16; B60L 2220/58; B60L 2240/425; B60L 2240/525; B60L 2270/145; H01L 2224/49111; H01L 2924/13055; H01L 2924/13091; H01L 2924/00; Y02T 10/64
USPC .......................... 29/596; 310/53, 68 R, 68 D
See application file for complete search history.

(56) References Cited

U.S. PATENT DOCUMENTS

| | | | |
|---|---|---|---|
| 2008/0053639 A1* | 3/2008 | Lin | .................... H05K 7/20172 165/80.3 |
| 2011/0095659 A1* | 4/2011 | Hattori | .................. F04B 39/121 310/68 D |

FOREIGN PATENT DOCUMENTS

| | | | | |
|---|---|---|---|---|
| GB | 2459061 A | | 10/2009 | |
| GB | 2462948 A | | 3/2010 | |
| GB | 2494797 A | | 3/2013 | |
| JP | H11225459 A | | 8/1999 | |
| JP | 2003274606 A | * | 9/2003 | ............... H02K 5/20 |
| JP | 2008174097 A | | 7/2008 | |
| JP | 2008253041 A | | 10/2008 | |
| WO | 2013059027 A1 | | 4/2013 | |
| WO | 2013069129 A1 | | 5/2013 | |
| WO | 2013118670 A1 | | 8/2013 | |

OTHER PUBLICATIONS

European Patent Office; International Search Report; dated Jun. 30, 2015; World Intellectual Property Organization; Rijswijk.
Intellectual Property Office; Search Report; dated Aug. 21, 2013; Intellectual Property Office; South Wales.
Intellectual Property Office; Search Report—First; dated Sep. 20, 2013; Intellectual Property Office; South Wales.
European Patent Office, Written Opinion of the Searching Authority, dated Sep. 26, 2015, World Intellectual Property Office, Rijswijk.

* cited by examiner

CONTROL MODULE FOR AN ELECTRIC MOTOR OR GENERATOR

The present invention relates to a control module for an electric motor or generator.

Electric motor systems typically include an electric motor and a control unit arranged to control the power of the electric motor. Examples of known types of electric motor include the induction motor, synchronous brushless permanent magnet motor, switched reluctance motor and linear motor. In the commercial arena three phase electric motors are the most common kind of electric motor available.

A three phase electric motor typically includes three coil sets, where each coil set is arranged to generate a magnetic field associated with one of the three phases of an alternating voltage.

To increase the number of magnetic poles formed within an electric motor, each coil set will typically have a number of coil sub-sets that are distributed around the periphery of the electric motor, which are driven to produce a rotating magnetic field.

By way of illustration, FIG. 1 shows a typical three phase electric motor 10 having three coil sets 14, 16, 18. Each coil set consists of four coil sub-sets that are connected in series, where for a given coil set the magnetic field generated by the respective coil sub-sets will have a common phase.

The three coil sets of a three phase electric motor are typically configured in either a delta or wye configuration.

A control unit for a three phase electric motor having a DC power supply will typically include a three phase bridge inverter that generates a three phase voltage supply for driving the electric motor. Each of the respective voltage phases is applied to a respective coil set of the electric motor.

A three phase bridge inverter includes a number of switching devices, for example power electronic switches such as Insulated Gate Bipolar Transistor (IGBT) switches, which are used to generate an alternating voltage from a DC voltage supply.

However, the greater the distance the control unit is located from the electric motor the larger the associated current loop will be for the current flow within the electric motor system, where an increase in current loop size will have the effect of increasing the inductance of the electric motor.

As the inductance of the overall electric motor system increases, the greater the voltage transients will be when a variation in current flow occurs, for example upon operation of the inverter switches when generating an alternating voltage supply. The higher the voltage transients are within an electric motor system the greater the power rating for the inverter switches within an electric motor inverter need to be, where higher power rated switches having slower switching speeds and larger switching losses than corresponding smaller switching devices.

However, the environmental conditions associated with the operation of an electric motor mounted within a wheel of a vehicle, for providing drive, can impose significant operational constraints if the associated control unit is mounted on, or adjacent to, the electric motor.

It is desirable to improve this situation

In accordance with an aspect of the present invention there is provided a control module and method according to the accompanying claims.

The present invention provides the advantage of allowing cooling to be supplied to the control module while also providing environmental protection to electrical components mounted within the control module. Additionally, the present invention provides structural support for printed circuit boards and components mounted on the printed circuit boards that are housed with the control module.

The present invention will now be described, by way of example, with reference to the accompanying drawings, in which.

The embodiment of the invention described is for a control module for an electric motor, where the electric motor is for use in a wheel of a vehicle. However the electric motor may be located anywhere within the vehicle. The motor is of the type having a set of coils being part of the stator for attachment to a vehicle, radially surrounded by a rotor carrying a set of magnets for attachment to a wheel. For the avoidance of doubt, the various aspects of the invention are equally applicable to an electric generator having the same arrangement. As such, the definition of electric motor is intended to include electric generator. In addition, some of the aspects of the invention are applicable to an arrangement having the rotor centrally mounted within radially surrounding coils. As would be appreciated by a person skilled in the art, the present invention is applicable for use with other types of electric motors.

Figure 1:
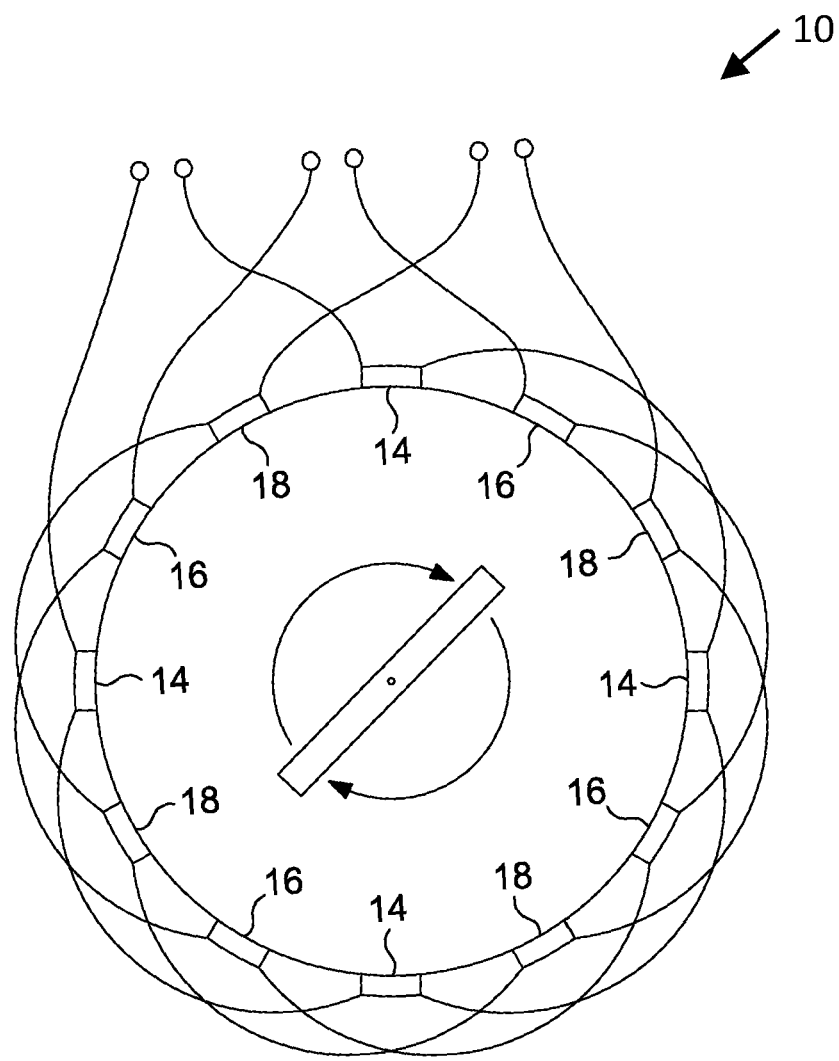
FIG. 1 illustrates a prior art three phase electric motor.
Figure 2:
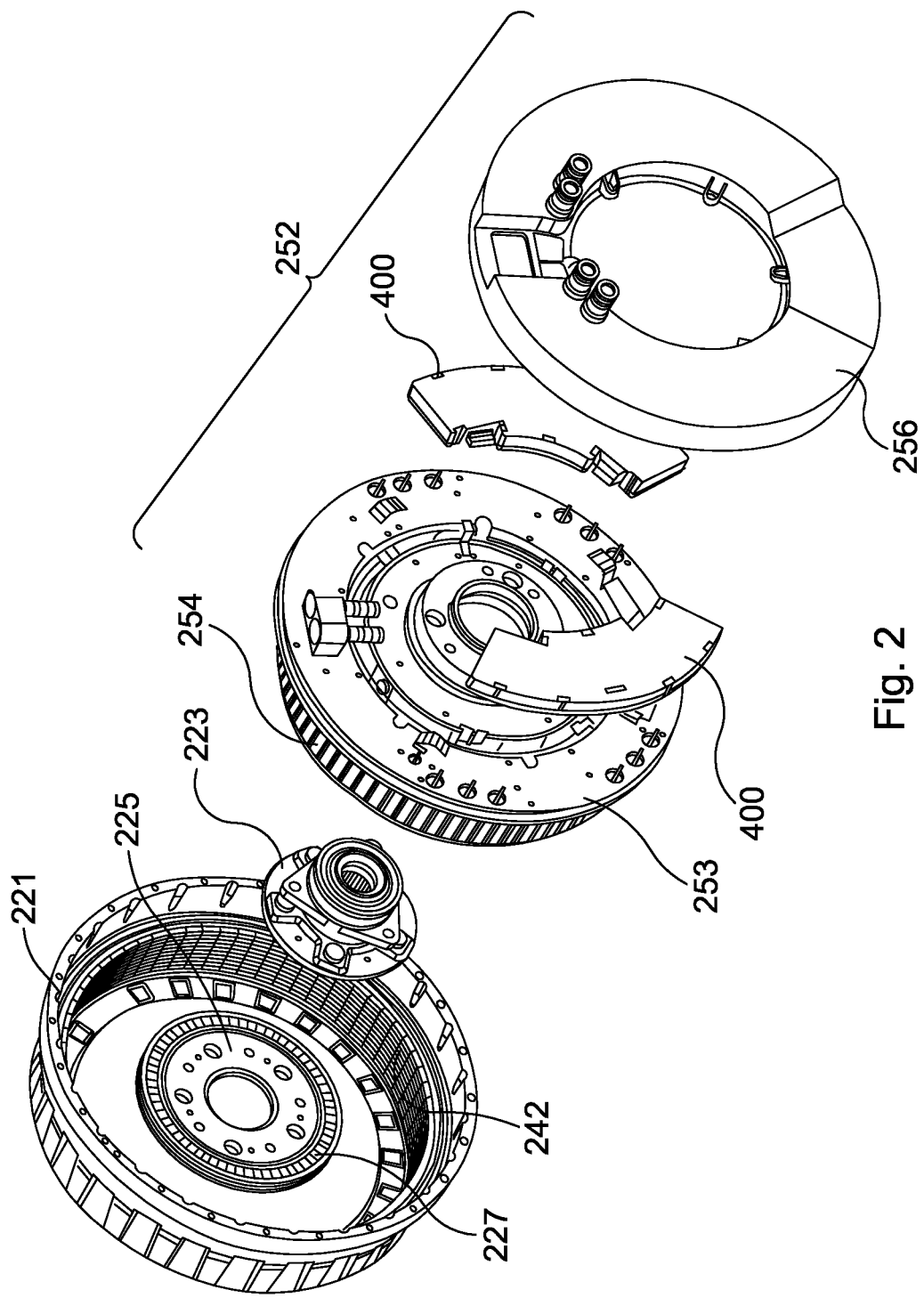
FIG. 2 illustrates an exploded view of a motor embodying the present invention.
Figure 3:
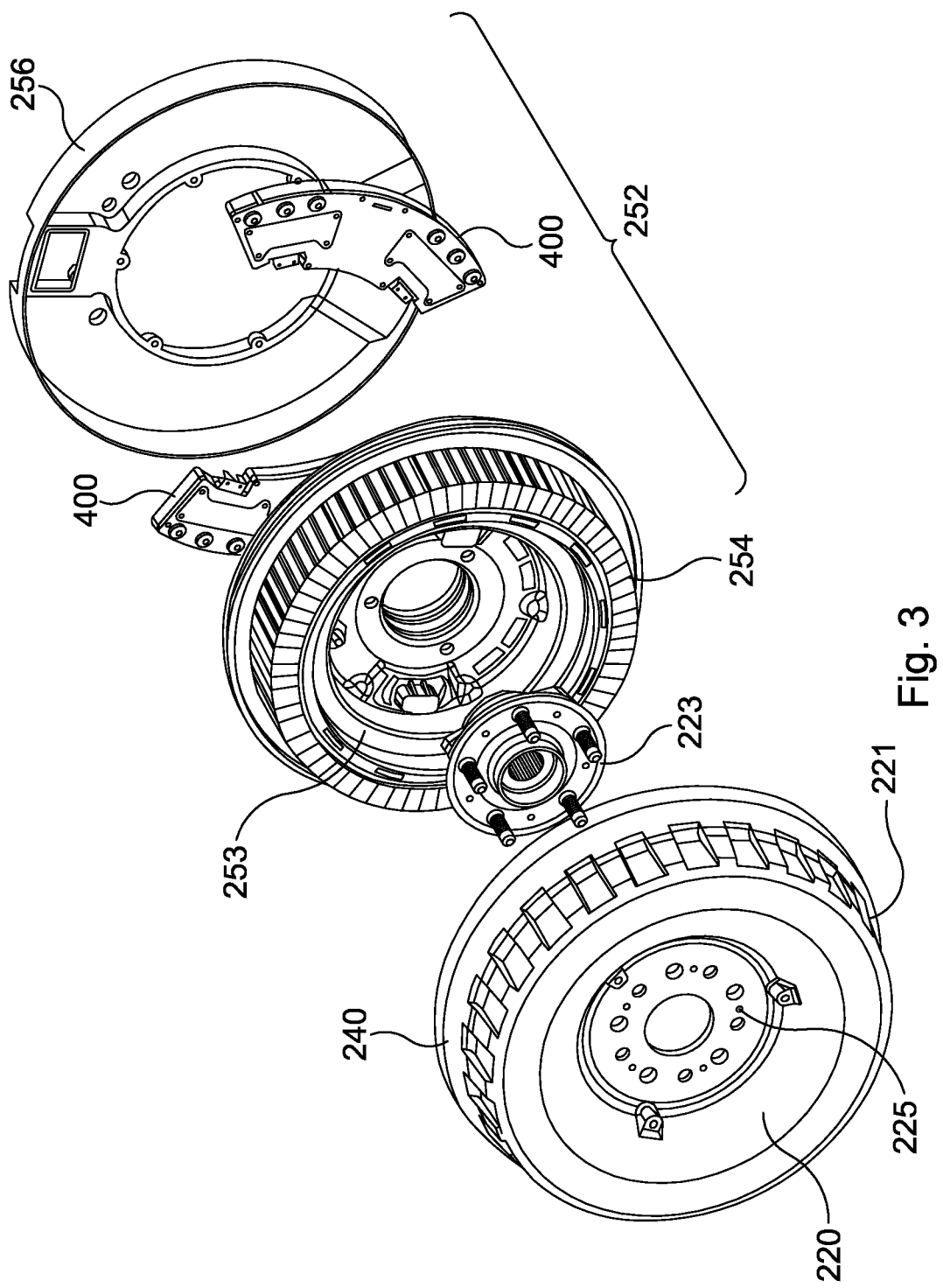
FIG. 3 illustrates an exploded view of the electric motor shown in FIG. 1 from an alternative angle.

For the purposes of the present embodiment, as illustrated in FIG. 2 and FIG. 3, the in-wheel electric motor includes a stator 252 comprising a heat sink 253, multiple coils 254, two control modules 400 mounted on the heat sink 253 on a rear portion of the stator for driving the coils, and an annular capacitor mounted on the stator within the inner radius of the two control modules 400. The coils 254 are formed on stator tooth laminations to form coil windings, where the stator tooth laminations are mounted on the heat sink 253. The heat sink 253 includes at least one cooling channel for allowing a coolant to flow within the heat sink 253 for providing cooling, thereby allowing the heat sink 253 to extract heat from components attached to the heat sink 253, for example the coil windings and the control modules. A stator cover 256 is mounted on the rear portion of the stator 252, enclosing the control modules 400 to form the stator 252, which may then be fixed to a vehicle and does not rotate relative to the vehicle during use.

Figure 5:
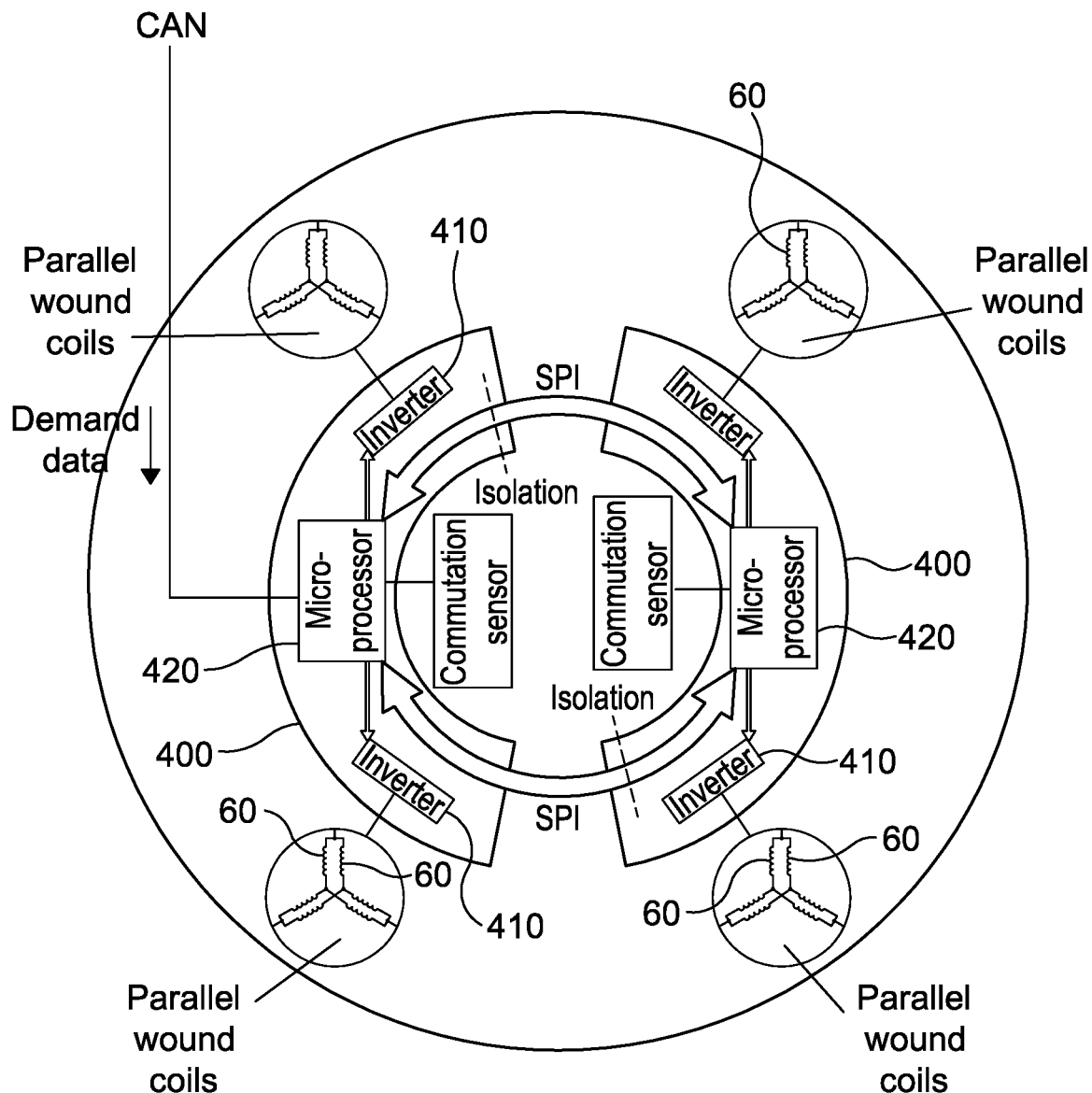
FIG. 5 illustrates an electric motor according to an embodiment of the present invention.

Each control module 400 includes two inverters 410 and control logic 420, which in the present embodiment includes a processor, for controlling the operation of the inverters 410, which is schematically represented in FIG. 5.

The annular capacitor is coupled across the inverters 410 for distributing the DC power supply to the inverters 410 and for reducing voltage ripple on the electric motor's power supply line, otherwise known as the DC busbar, during operation of the electric motor. For reduced inductance the capacitor is mounted adjacent to the control modules 400.

A rotor 240 comprises a front portion 220 and a cylindrical portion 221 forming a cover, which substantially surrounds the stator 252. The rotor includes a plurality of permanent magnets 242 arranged around the inside of the cylindrical portion 221. For the purposes of the present embodiment 32 magnet pairs are mounted on the inside of the cylindrical portion 221. However, any number of magnet pairs may be used.

The magnets are in close proximity to the coil windings on the stator 252 so that magnetic fields generated by the coils interact with the magnets 242 arranged around the inside of the cylindrical portion 221 of the rotor 240 to cause the rotor 240 to rotate. As the permanent magnets 242 are utilized to generate a drive torque for driving the electric motor, the permanent magnets are typically called drive magnets.

The rotor 240 is attached to the stator 252 by a bearing block 223. The bearing block 223 can be a standard bearing block as would be used in a vehicle to which this motor assembly is to be fitted. The bearing block comprises two parts, a first part fixed to the stator and a second part fixed to the rotor. The bearing block is fixed to a central portion 253 of the wall of the stator 252 and also to a central portion 225 of the housing wall 220 of the rotor 240. The rotor 240 is thus rotationally fixed to the vehicle with which it is to be used via the bearing block 223 at the central portion 225 of the rotor 240. This has an advantage in that a wheel rim and tyre can then be fixed to the rotor 240 at the central portion 225 using the normal wheel bolts to fix the wheel rim to the central portion of the rotor and consequently firmly onto the rotatable side of the bearing block 223. The wheel bolts may be fitted through the central portion 225 of the rotor through into the bearing block itself. With both the rotor 240 and the wheel being mounted to the bearing block 223 there is a one to one correspondence between the angle of rotation of the rotor and the wheel.

FIG. 3 shows an exploded view of the same motor assembly illustrated in FIG. 2 from the opposite side. The rotor 240 comprises the outer rotor wall 220 and circumferential wall 221 within which magnets 242 are circumferentially arranged. As previously described, the stator 252 is connected to the rotor 240 via the bearing block at the central portions of the rotor and stator walls.

A V shaped seal is provided between the circumferential wall 221 of the rotor and the outer edge of the stator.

The rotor also includes a set of magnets 227 for position sensing, otherwise known as commutation magnets, which in conjunction with sensors mounted on the stator allows for a rotor flux angle to be estimated. The rotor flux angle defines the positional relationship of the drive magnets to the coil windings. Alternatively, in place of a set of separate magnets the rotor may include a ring of magnetic material that has multiple poles that act as a set of separate magnets.

To allow the commutation magnets to be used to calculate a rotor flux angle, preferably each drive magnet has an associated commutation magnet, where the rotor flux angle is derived from the flux angle associated with the set of commutation magnets by calibrating the measured commutation magnet flux angle. To simplify the correlation between the commutation magnet flux angle and the rotor flux angle, preferably the set of commutation magnets has the same number of magnets or magnet pole pairs as the set of drive magnet pairs, where the commutation magnets and associated drive magnets are approximately radially aligned with each other. Accordingly, for the purposes of the present embodiment the set of commutation magnets has 32 magnet pairs, where each magnet pair is approximately radially aligned with a respective drive magnet pair.

A sensor, which in this embodiment is a Hall sensor, is mounted on the stator. The sensor is positioned so that as the rotor rotates each of the commutation magnets that form the commutation magnet ring respectively rotates past the sensor.

As the rotor rotates relative to the stator the commutation magnets correspondingly rotate past the sensor with the Hall sensor outputting an AC voltage signal, where the sensor outputs a complete voltage cycle of 360 electrical degrees for each magnet pair that passes the sensor.

For improved position detection, preferably the sensor includes an associated second sensor placed 90 electrical degrees displaced from the first sensor.

Figure 4:
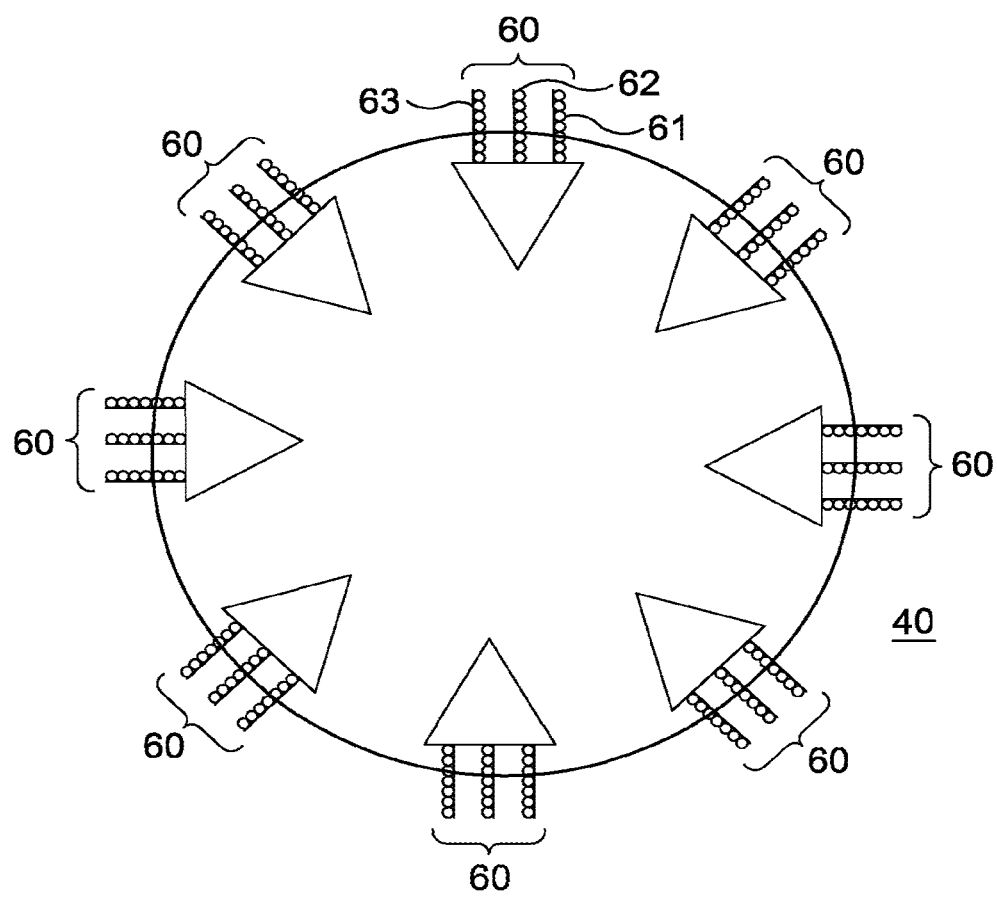
FIG. 4 illustrates an electric motor according to an embodiment of the present invention.

As illustrated in FIG. 4, in the present embodiment the electric motor includes four coil sets 60 with each coil set 60 having three coil sub-sets 61, 62, 63 that are coupled in a wye configuration to form a three phase sub-motor, resulting in the motor having four three phase sub-motors. The operation of the respective sub-motors is controlled via one of two control devices 400, as described below. However, although the present embodiment describes an electric motor having four coil sets 60 (i.e. four sub motors) the motor may equally have one or more coil sets with associated control devices. In a preferred embodiment the motor 40 includes eight coil sets 60 with each coil set 60 having three coil sub-sets 61, 62, 63 that are coupled in a wye configuration to form a three phase sub-motor, resulting in the motor having eight three phase sub-motors. Similarly, each coil set may have any number of coil sub-sets, thereby allowing each sub-motor to have two or more phases.

FIG. 5 illustrates the connections between the respective coil sets 60 and the control modules 400, where a respective coil set 60 is connected to a respective three phase inverter 410 included in a control module 400. As is well known to a person skilled in the art, a three phase inverter contains six switches, where a three phase alternating voltage may be generated by the controlled operation of the six switches. However, the number of switches will depend upon the number of voltage phases to be applied to the respective sub motors, where the sub motors can be constructed to have any number of phases.

Figure 6:
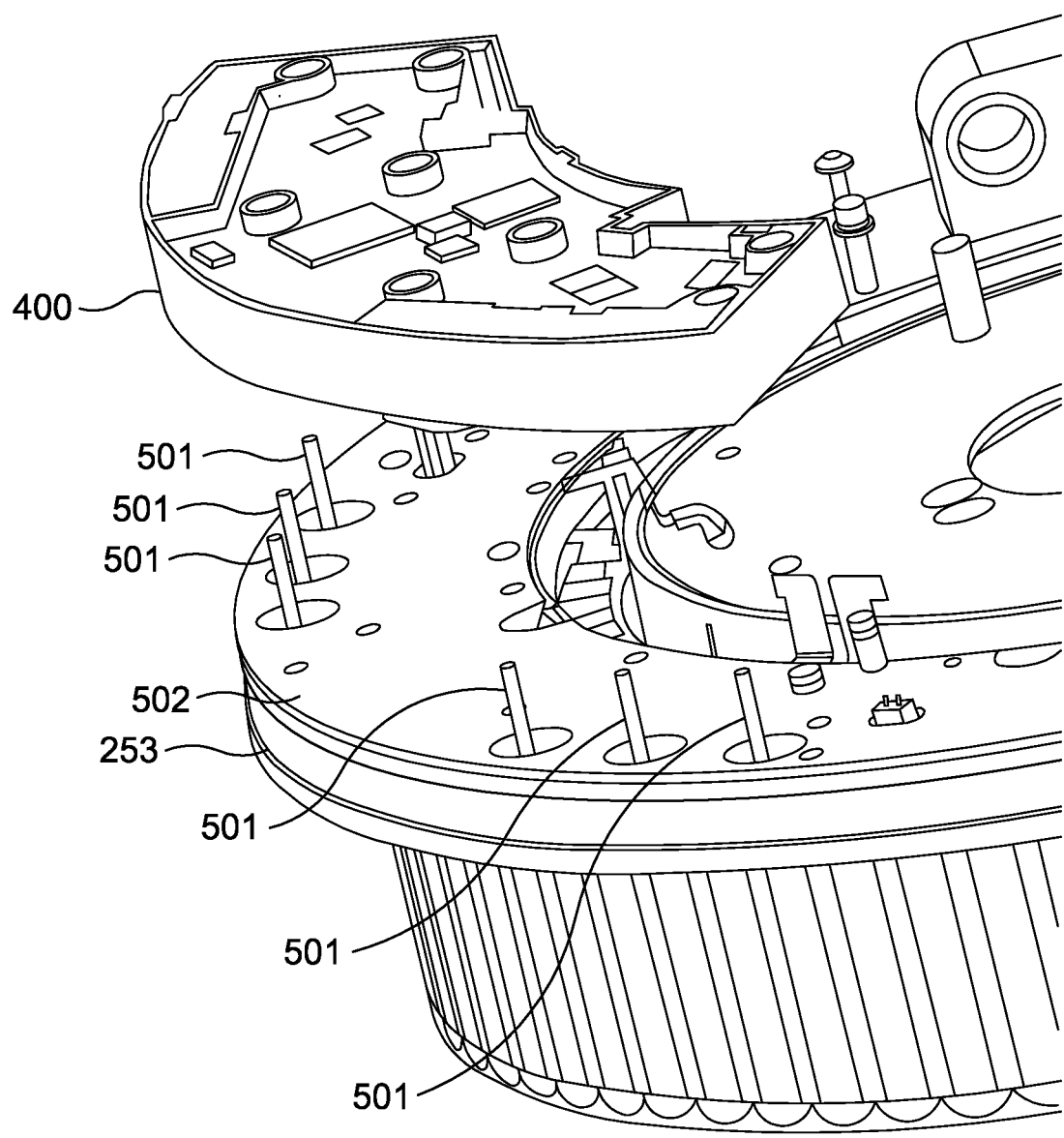
FIG. 6 illustrates a partial view for an electric motor according to an embodiment of the present invention.

The respective coils of the four coil sets are wound on individual stator teeth, which form part of the stator. The end portions 501 of the coil windings protrude through the planar rear portion 502 of the stator heat sink, as illustrated in FIG. 6. FIG. 6 illustrates a partial perspective view of the stator, where the end portions 501 of the coil windings for two of the four coil sets 60 extend away from the planar portion of the stator heat sink 253.

The control modules 400 are positioned adjacent to the planar portion of the stator heat sink 253, for mounting to the planar portion of the stator heat sink 253, as described below. For illustration purposes, a view of a single control module 400 separated from the stator heat sink 253 is shown in FIG. 6.

For the purposes of the present embodiment, the planar portion of the heat sink 253 is located on the side of the stator that is intended to be mounted to a vehicle.

Preferably, to facilitate the mounting of the respective control modules 400 to the stator heat sink 253, the end sections 501 of the coil windings for the respective coil sets are arranged to extend away from the heat sink portion of the stator in substantially a perpendicular direction relative to the surface of the heat sink portion of the stator.

Figure 7:
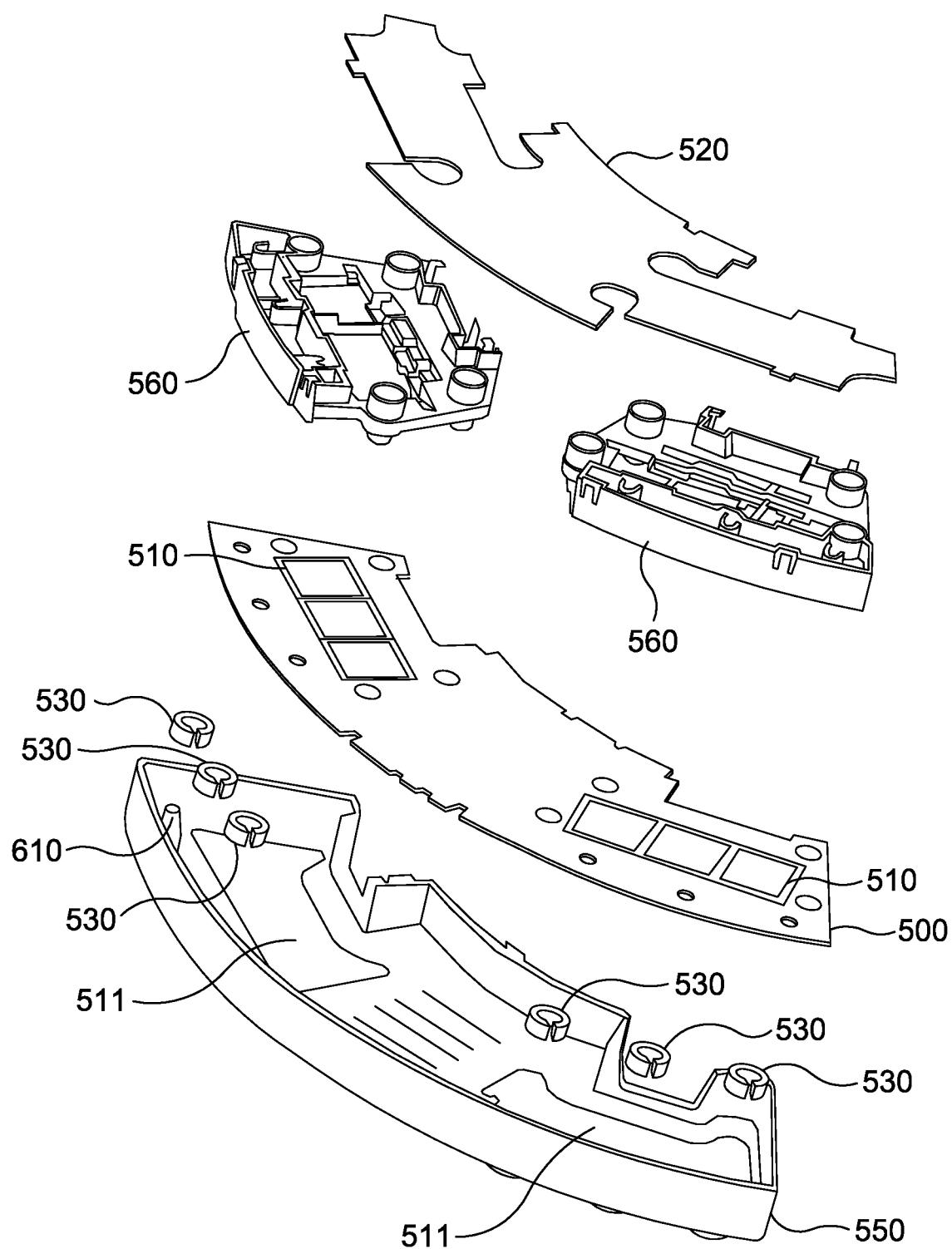
FIG. 7 illustrates a control module for an electric motor according to an embodiment of the present invention.

FIG. 7 illustrates a modular construction of the control module 400 with an exploded view of a preferred embodiment of a control module 400, where each control module 400, otherwise known as a power module, includes a power printed circuit board 500 in which are mounted two power substrate assemblies 510, a control printed circuit board 520, four power source busbars (not shown) for connecting to a DC battery, six phase winding busbars (not shown) for connecting to respective coil windings, two insert modules 560 and six current sensors. Each current sensor includes a Hall sensor and a section of soft ferromagnetic material 530 arranged to be mounted adjacent to the Hall sensor, where preferably each Hall sensor is arranged to be mounted in a cutout section of a piece of soft ferromagnetic material fashioned in a toroid shape.

Each of the control module components are mounted within a control module housing 550 with the four power source busbars and the six phase winding busbars being mounted, via the respective insert modules, on the power printed circuit board 500 on opposite sides of the control device housing 550.

Each power substrate 510 is arranged to be mounted in a respective aperture formed in the power printed circuit board 500, where each of the power substrates 510 has a 3 mm copper base plate 600 upon which is formed a three phase inverter 410. A corresponding aperture 511 is also formed in the control module housing 550 so that the copper base plate for each of the power substrates 510 is placed in direct contact with the stator heat sink 253 when the control device housing 550 is mounted to the stator, thereby allowing for cooling to be applied directly to the base of each of the power substrates 510.

Additionally, mounted on the underside of the power printed circuit board 500, adjacent to the copper base plate of the power substrate assemblies 510, are six Hall sensors (not shown) for measuring the current in the respective coil windings associated with two of the four coil sets. The Hall sensor readings are provided to the control printed circuit board 520.

The power printed circuit board 500 includes a variety of other components that include drivers for the inverter switches formed on the power substrate assemblies 510, where the drivers are used to convert control signals from the control printed circuit board 520 into a suitable form for operating switches mounted on the power printed circuit board 500, however these components will not be discussed in any further detail.

The insert modules 560 are arranged to be mounted over the power printed circuit board 500 when the power printed circuit board 500 is mounted in the control module housing 550.

Each insert module 560 is arranged to be mounted over a respective power substrate assembly 510 mounted on the power printed circuit board 500, with each insert module 560 having an aperture arranged to extend around inverter switches formed on a respective power substrate assembly 510.

Each insert module 560 is arranged to carry two power source busbars and three phase windings busbars for coupling the inverter formed on the power substrate assembly 510, over which the insert module 560 is mounted, to the DC power source and to the phase windings of a coil set, respectively.

The insert module 560 also acts as a spacer for separating the control printed circuit board 520 from the power printed circuit board 500 when both the power printed circuit board 500 and the control printed circuit board 520 are mounted in the control module housing 550.

A first pair of the power source busbars is for providing a voltage source to an inverter 410 formed on one of the power substrates assemblies 510. A second pair of the power source busbars is for providing a voltage source to the inverter 410 formed on the other power substrate assembly 510.

For each pair of power source busbars, one of the power source busbars is located in a first plane formed above the plane of the power circuit board 500. The other power source busbar is located in a second plane above the first plane. Preferably, each pair of power source busbars are arranged to be substantially co-planar.

Located in the control module housing 550 on the opposite side of the respective power substrate assemblies 510 to the power source busbars are the six phase winding busbars. A phase winding busbar is coupled to each inverter leg for coupling to a respective coil winding, as is well known to a person skilled in the art (i.e. a phase winding busbar is coupled to each leg of the three phase inverter formed on one of the power substrate assemblies 510 and a phase winding busbar is coupled to each leg of the three phase inverter formed on the other power substrate assembly 510).

The control printed circuit board 520 is arranged to be mounted in the control module housing 550 above the power printed circuit board 500.

The control printed circuit board 520 includes a processor 420 for controlling the operation of the respective inverter switches to allow each of the electric motor coil sets 60 to be supplied with a three phase voltage supply using PWM voltage control across the respective coil sub-sets 61, 62, 63. For a given torque requirement, the three phase voltage applied across the respective coil sets is determined using field oriented control FOC, which is performed by the processor on the control printed circuit board using the current sensors mounted within the control module housing 550 for measuring the generated current.

The three phase voltage supply results in the generation of current flow in the respective coil sub-sets and a corresponding rotating magnetic field for providing a required torque by the respective sub-motors.

Additionally, each control printed circuit board 520 includes an interface arrangement to allow communication between the respective control modules 400 via a communication bus with one control module 400 being arranged to communicate with a vehicle controller mounted external to the electric motor, where the externally mounted controller will typically provide a required torque value to the control module 400. The processor 420 on each control modules 400 is arranged to handle communication over the interface arrangement.

As stated above, although the present embodiment describes each coil set 60 as having three coil sub-sets 61, 62, 63, the present invention is not limited by this and it would be appreciated that each coil set 60 may have one or more coil sub-sets.

PWM control works by using the motor inductance to average out an applied pulse voltage to drive the required current into the motor coils. Using PWM control an applied voltage is switched across the motor windings. During the period when voltage is switched across the motor coils, the current rises in the motor coils at a rate dictated by their inductance and the applied voltage. The PWM voltage control is switched off before the current has increased beyond a required value, thereby allowing precise control of the current to be achieved.

The inverter switches can include semiconductor devices such as MOSFETs or IGBTs. In the present example, the switches comprise IGBTs. However, any suitable known switching circuit can be employed for controlling the current. One well known example of such a switching circuit is the three phase bridge circuit having six switches configured to drive a three phase electric motor. The six switches are configured as three parallel sets of two switches, where each pair of switches is placed in series and form a leg of the three phase bridge circuit. A DC power source is coupled across the legs of the inverter, with the respective coil windings of an electric motor being coupled between a respective pair of switches, as is well known to a person skilled in the art. A single phase inverter will have two pairs of switches arranged in series to form two legs of an inverter.

To allow the respective coil windings for two of the four coil sets 60 to be coupled to a respective phase winding busbar within a control module housing 550, the control module housing 550 is arranged to have six apertures 610.

The six apertures 610 are formed on an outer edge of the control module housing 550 on the side of the housing 550 that is to be mounted adjacent to the planar portion of the stator heat sink 253.

The size and position of the six apertures 610 formed in the control module housing 550 are arranged to match the positions and diameters of the end portions of the coil windings that extend from the planar portion of the stator heat sink 253, thereby allowing the respective end portions of the coil windings to extend through the apertures 610 when the control housing module 550 is mounted on to the planar portion of the stator heat sink 253.

Figure 8:
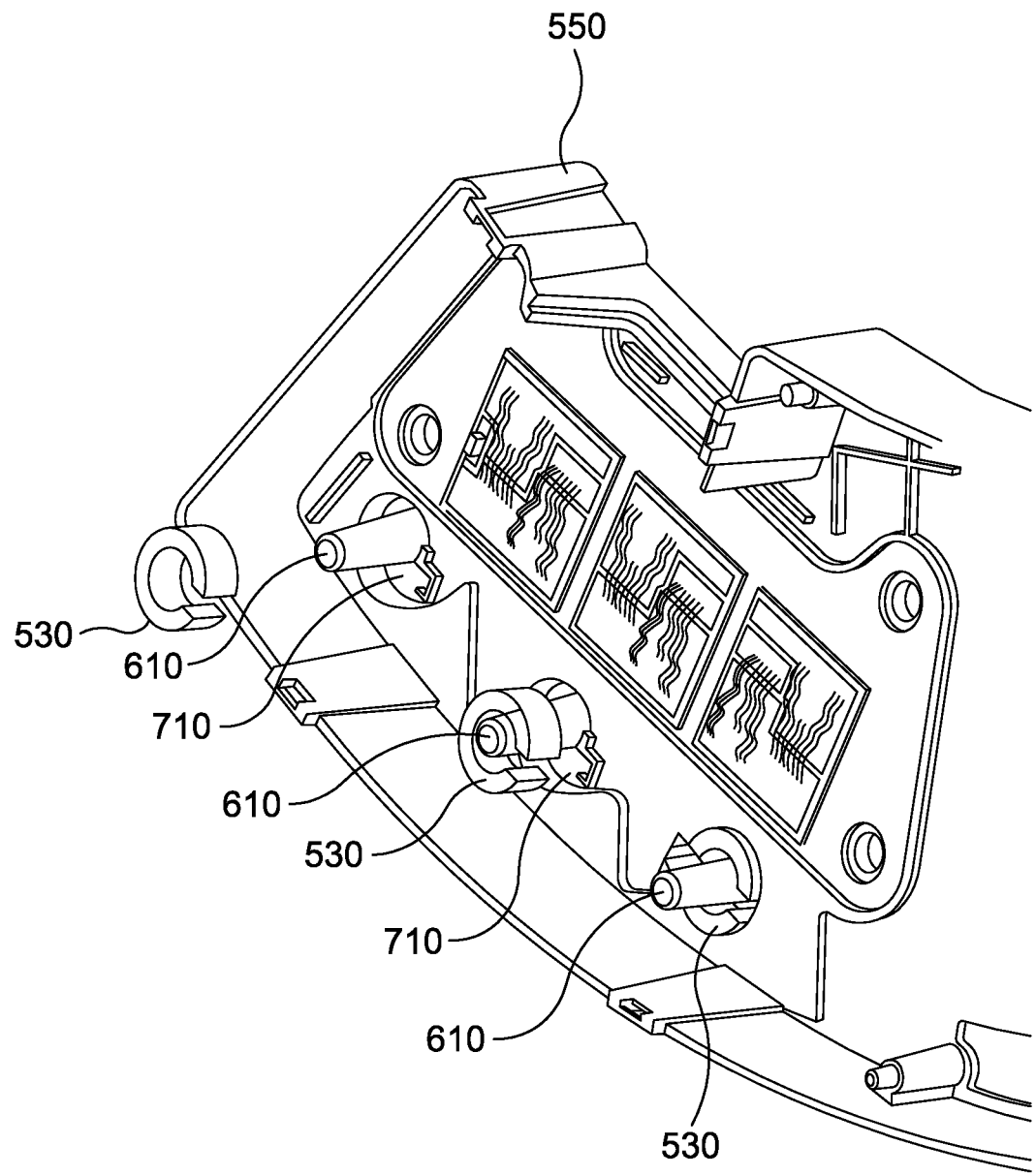
FIG. 8 illustrates a partial view of a control module housing according to an embodiment of the present invention.

A partial perspective view of the control module housing 550 is illustrated in FIG. 8. A recess 710 is formed around each of the six apertures 610 formed in the control module housing 550, where each recess 710 is sized to allow a partial toroid made of soft ferromagnetic material 530, for example a ferrite element, to be located in the recess 710. The top of the partial toroid is arranged to be substantially level with the bottom section of the control module housing 550 when the partial toroid 530 is mounted in a recess 710. The partial toroid of electrical steel 530 has a section missing from the toroid that substantially corresponds to the size of the Hall sensor mounted on the power printed circuit board 500. To facilitate the guiding of the coil windings as they pass through the aperture 610, the control module housing 550 is arranged to have a conduit section formed around each aperture 610. The conduit sections formed around each of the respective apertures also prevent an elastomer placed in the control module housing 550 from escaping through the apertures during the curing process for the elastomer.

Preferably the recesses 710 formed in the base of the control module housing 550 are keyed to ensure that the partial toroids of soft ferromagnetic material 530 can only be oriented within a recess 710 in a position where the missing section of the toroid is aligned with the position of the Hall sensor mounted on the power printed circuit board 500 when the power printed circuit board 500 is mounted within the control module housing 550.

Once the partial toroids of soft ferromagnetic material 530 have been mounted in the respective recesses 710 formed in the base of the control module housing 550, the power printed circuit board 500 is lowered into position in the control module housing. For illustration purposes, to allow a clear view of the soft ferromagnetic material 530 mounted in the recesses 710 formed in the base of the control module housing 550, FIG. 8 shows a power substrate 510 mounted in an aperture 511 formed in the control module housing 550 without being first mounted to a power printed circuit board. However, as described above, the power substrate will first be mounted to the power printed circuit board before being placed in the control module housing 550. Upon the power printed circuit board 500 being lowered into position in the control module housing 550, as a result of the alignment of the partial toroids of soft ferromagnetic material 530 and the Hall sensors mounted on the power printed circuit board 500, the Hall sensors mounted on the power printed circuit board 500 are inserted into the missing sections of the respective partial toroids 530 mounted in the control module housing 550.

Once the power printed circuit board 500 has been lowered into position in the control module housing the insert modules are positioned over a respective power substrate assembly with the respective inverter formed on the power substrates being coupled to the respective power source busbars and phase winding busbars.

Each of the phase winding busbars formed on the respective insert modules are arranged to include a coupling section for coupling the phase winding busbar to a phase winding of one of the coil sets. The coupling section for each phase winding busbar is arranged to extend around a respective aperture 610 formed in the base of the control module housing 550.

Once the power printed circuit board 500 and the insert modules 560 have been mounted in the control module housing 550 an elastomer, for example a silicone rubber, is introduced into the control module housing 550 in a two stage process. An example of a suitable elastomer is Wacher SilGel® 613, which is a pourable addition curing (Room Temperature Vulcanizing) RTV-2 silicon that vulcanizes at room temperature to a very soft silicone gel.

In the first stage of introducing the elastomer into the control module housing 550 a first batch of a predetermined amount of elastomer, in liquid form, is combined with an activator (i.e. a curing agent).

The elastomer and activator mix is injected into the control module housing 550, in liquid form, so that the elastomer and activator mix covers the power printed circuit board 500, the power substrate assemblies 510 and the components mounted on the power printed circuit board 500 and the power substrate assemblies 510. The amount of elastomer selected allows the elastomer and activator mix to cover the power printed circuit board 500, the power substrate assemblies 510 and the components mounted on the power printed circuit board 500 and the power substrate assemblies 510 by a predetermined amount.

Preferably, to accelerate the curing process the control module housing 550 is placed in a pre-heated oven during the curing process.

To aid the removal of air from the control module housing 550 it is preferable for the curing process to be performed in a vacuum or near vacuum environment.

Once the elastomer has been cured, the control module housing 550 is removed from the oven and allowed to cool.

Once the control module housing 550 has cooled the control printed circuit board 520 is mounted in the control module housing 550 above the power printed circuit board 500, with the control printed circuit board 520 being electrically coupled to the power printed circuit board 500 to allow the control printed circuit board 520 to control the operation of the switches on the inverters formed on the power substrate assemblies 510.

In the second stage of introducing the elastomer into the control module housing 550, a second batch of a predetermined amount of elastomer, in liquid form, is combined with an activator (i.e. a curing agent).

The elastomer and activator mix is injected into the control module housing 550, in liquid form, so that the elastomer and activator mix fills any air gaps between the power printed circuit board and the control printed circuit board 520. Additionally, the second batch of elastomer and activator mix covers the control printed circuit board 520, and the components mounted on the control printed circuit board 520. The amount of elastomer selected for the second stage allows the elastomer and activator mix to cover the control printed circuit board 520 and the components mounted on the control printed circuit board 520 by a predetermined amount.

To allow the elastomer and activator mix to enter between the power printed circuit board 500 and the control printed circuit board 520, preferably the control printed circuit board 520 has one or more apertures formed on it to allow the elastomer and activator mix to enter through the control printed circuit board 520 and into the gap formed between the power printed circuit board 500 and the control printed circuit board 520.

Preferably, to accelerate the curing process the control module housing 550 is placed in a pre-heated oven during the curing process of the second batch of elastomer and activator mix.

To aid the removal of any air trapped within the control module housing 550 it is preferable for the curing process to be performed in a vacuum or near vacuum environment.

Once the elastomer has been cured the control module housing 550 is removed from the oven and allowed to cool.

Once the control module housing 550 has cooled the control module 400 is mounted to the stator.

The cured elastomer formed over the components on the power printed circuit board 500 and control printed circuit board 520 provide an environmental barrier to dirt and liquids, which the electric motor may be required to operate in.

As the cured elastomer encapsulates the components on the power printed circuit board 500 and the control printed circuit board 520, the cured elastomer also provides structural support to these components and their respective electrical connections. The use of a soft elastomer, such as Wacher SilGil® 613, allows bonding wires, and other forms of electrical connections to the components on the power printed circuit board 500 and the control printed circuit board 520, to expand and move as a result of thermal expansion while also acting as a cushion to the components, and their respective connections, from shock and vibration that result from the control module being attached to an in-wheel electric motor that may operate over rough terrain.

The elastomer also acts as an electrical insulator, thereby allowing the components on the power printed circuit board 500 and control printed circuit board 520 to be mounted closer to each other than would be possible without the use of the elastomer, thereby allowing the overall size of the power printed circuit board 500 and control printed circuit board 520 to be reduced.

Additionally, the layer of elastomer formed between the power printed circuit board 500 and the control printed circuit board 520 provides structural support to the control printed circuit board 520, thereby allowing the number of mounting locations on the control printed circuit board 520 to be reduced. This allows the available surface area for electrical components on the control printed circuit board 520 to be reduced. The elastomer formed between the power printed circuit board 500 and the control printed circuit board 520 also acts as a shock absorber to the control printed circuit board 520, thereby providing further protection to the control printed circuit board 520 and its components from vibration and shock generated on or by the electric motor to which the control module is attached.

To mount the control module 400 to the stator, the respective end sections of the coil windings for two coil sets 60 that extend away from the planar surface of the stator heat sink 253 (i.e. six coil winding end sections) are aligned with the respective apertures 610 formed in the base of the control module housing 550. The control module 400 is then pushed flush with the surface of the stator so that the respective end sections of the coil windings for two coil sets 60 that extend away from the planar surface of the stator heat sink 253 (i.e. six coil winding end sections) extend through the respective apertures 610 formed in the base of the control module housing 550 with each of the current sensors mounted in the control module 400 being mounted adjacent to a respective end section of a coil winding.

The control module may be mounted to the stator by any suitable means, for example one or more bolts that extend through the control module into the surface of the stator heat sink.

Once the control module has been mounted to the stator, the respective coupling sections of the phase winding busbars mounted on the power printed circuit board 500 are coupled to a respective end section of a coil winding, where any suitable means may be used to couple the coupling section of the phase winding busbar to a respective end section of a coil winding, for example crimping or welding.

The inverter 410 formed on one power assembly 510, which is coupled via the respective phase winding busbars to a first coil set 60, is arranged to control current in the first coil set. The other inverter 410 formed on the other power assembly 510 in the control module 400 is arranged to control current in a second coil set 60, where the current measurements made by the respective current sensors are used by the processor on the control printed circuit board 520 to control current in the respective coil sets 60. Similarly, the second control module 400 is arranged to control current in a third and fourth coil set 60.

It will be apparent to those skilled in the art that the disclosed subject matter may be modified in numerous ways and may assume embodiments other than the preferred forms specifically set out as described above, for example, instead of the elastomer being introduced into the control module housing 550 in a two stage process, the elastomer may be introduced in a single process after the control module components have been mounted in the control module housing 550, or in a three or more stage process.

The invention claimed is:

1. A control module for an electric motor having a stator that includes a cooling element having a first surface, wherein cooling fluid is arranged to flow within channels of the cooling element for providing cooling to the first surface, the control module comprising:
   a power device having a second surface on which switching elements are mounted, the switching elements for controlling current flow in coil windings mounted on the stator;
   a control device for controlling the operation of the switching elements;
   a housing with a first side that includes an aperture for allowing the second surface of the power device on which the switching elements are mounted to contact the first surface of the cooling element for providing cooling to the switching elements when the first side of the housing is mounted to the first surface of the cooling element, wherein the control device is arranged to be mounted in the housing on an opposite side of the power device to the first side of the housing and an elastomer is located over the power device and the control device for providing an electrical insulation barrier over the switching elements on the power device and electrical components on the control device.

2. A control module according to claim 1, wherein the elastomer located over the power device is arranged to provide structural support to the control device.

3. A control module according to claim 1, wherein the elastomer is a silicon rubber.

4. A control module according to claim 1, wherein the power device includes an inverter for controlling current flow in a first set of coil windings mounted on the stator.

5. A control module according to claim 1, wherein the power device includes a first inverter for controlling current flow in a first set of coil windings mounted on the stator and a second inverter for controlling current flow in a second set of coil windings mounted on the stator.

6. An electric motor comprising:
a stator that includes a cooling element having a first surface, wherein cooling fluid is arranged to flow within channels of the cooling element for providing cooling to the first surface; and
a control module comprising:
a power device having a second surface on which switching elements are mounted, the switching elements for controlling current flow in coil windings mounted on the stator;
a control device for controlling the operation of the switching elements;
a housing with a first side that includes an aperture for allowing the second surface of the power device on which the switching elements are mounted to contact the first surface of the cooling element for providing cooling to the switching elements when the first side of the housing is mounted to the first surface of the cooling element, wherein the control device is arranged to be mounted in the housing on an opposite side of the power device to the first side of the housing and an elastomer is located over the power device and the control device for providing an electrical insulation barrier over the switching elements on the power device and electrical components on the control device.

7. A method of assembling a control module for an electric motor having a stator that includes a cooling element having a first surface, wherein cooling fluid is arranged to flow within channels of the cooling element for providing cooling to the first surface, the method comprising:
mounting a power device having a second surface on which switching elements are mounted, the switching elements for controlling current flow in coil windings mounted on the stator in a housing having a first side having an aperture for mounting to the first surface of the cooling element, wherein the second surface of the power device on which the switching elements are mounted is exposed through the aperture formed in the first side of the housing such that the second surface contacts the first surface of the cooling element;
mounting a control device for controlling the operation of the switching elements in the housing on an opposite side of the power device to the first side of the housing; and
inserting an elastomer in the housing for providing an electrical insulation barrier over the switches on the power device and electrical components on the control device.

8. A method according to claim 7, wherein the elastomer is inserted between the power device and control device for providing structural support to the control device.

\* \* \* \* \*